United States Patent
Lee et al.

(10) Patent No.: US 7,609,538 B1
(45) Date of Patent: *Oct. 27, 2009

(54) LOGIC PROCESS DRAM

(75) Inventors: Winston Lee, Palo Alto, CA (US); Peter Lee, Fremont, CA (US); Sehat Sutardja, Cupertino, CA (US)

(73) Assignee: Marvell International Ltd., Hamilton (BM)

(*) Notice: Subject to any disclaimer, the term of this patent is extended or adjusted under 35 U.S.C. 154(b) by 221 days.

This patent is subject to a terminal disclaimer.

(21) Appl. No.: 11/449,957

(22) Filed: Jun. 9, 2006

Related U.S. Application Data

(60) Division of application No. 11/138,681, filed on May 27, 2005, now Pat. No. 7,184,290, which is a division of application No. 10/734,060, filed on Dec. 12, 2003, now Pat. No. 6,947,324, which is a continuation of application No. 10/336,423, filed on Jan. 2, 2003, now Pat. No. 6,680,859, which is a division of application No. 09/881,474, filed on Jun. 14, 2001, now Pat. No. 6,570,781.

(60) Provisional application No. 60/214,789, filed on Jun. 28, 2000.

(51) Int. Cl.
*G11C 5/06* (2006.01)

(52) U.S. Cl. ............... 365/63; 365/72; 365/51; 365/189.02; 365/230.02

(58) Field of Classification Search ............ 365/63, 365/72, 189.02, 230.02, 51
See application file for complete search history.

(56) References Cited

U.S. PATENT DOCUMENTS

| | | | |
|---|---|---|---|
| 4,627,033 A | 12/1986 | Hyslop et al. | |
| 4,694,428 A | 9/1987 | Matsumura et al. | |
| 4,807,195 A | 2/1989 | Busch et al. | |
| 4,833,518 A * | 5/1989 | Matsuda et al. | 257/301 |
| 4,914,502 A | 4/1990 | Lebowitz et al. | |
| 4,922,453 A * | 5/1990 | Hidaka | 365/63 |
| 4,922,460 A | 5/1990 | Furutani et al. | |
| 4,959,698 A | 9/1990 | Shinichi | |
| 4,967,396 A | 10/1990 | Kajigaya et al. | |
| 4,970,564 A | 11/1990 | Kimura et al. | |
| 5,014,110 A | 5/1991 | Satoh | |
| 5,058,065 A | 10/1991 | D'Luna | |
| 5,127,739 A | 7/1992 | Duvvury et al. | |
| 5,170,243 A * | 12/1992 | Dhong et al. | 365/208 |

(Continued)

FOREIGN PATENT DOCUMENTS

JP 404298073 10/1992

(Continued)

*Primary Examiner*—Viet Q Nguyen

(57) ABSTRACT

A semiconductor integrated circuit device includes a dynamic random access memory (DRAM) unit. The DRAM unit comprises a plurality of bit line pairs. Each bit line pair includes a first bit line and a second bit line. The first bit line and the second bit line within each bit line pair are aligned adjacent to each other. Each of a plurality of word lines is associated with the bit lines such that an array is formed by the bit lines and the associated word lines. Each bit line is associated with both first and second interconnect layers. Each of a plurality of memory cells is associated with every other bit line along each word line. Each of a plurality of amplifiers is in communication with a first bit line and a second bit line within a bit line pair.

30 Claims, 6 Drawing Sheets

U.S. PATENT DOCUMENTS

| | | | |
|---|---|---|---|
| 5,233,558 A | | 8/1993 | Fujii et al. |
| 5,241,497 A | | 8/1993 | Komarek |
| 5,250,831 A | * | 10/1993 | Ishii .......................... 257/354 |
| 5,276,641 A | | 1/1994 | Sprogis et al. |
| 5,416,734 A | * | 5/1995 | Hidaka et al. ................. 365/63 |
| 5,416,741 A | | 5/1995 | Ohsawa |
| 5,481,495 A | | 1/1996 | Henkels et al. |
| 5,485,419 A | * | 1/1996 | Campbell ..................... 365/69 |
| 5,528,542 A | * | 6/1996 | Okamura ..................... 365/205 |
| 5,534,732 A | | 7/1996 | Debrosse et al. |
| 5,566,104 A | * | 10/1996 | Shinkawata .................. 365/51 |
| 5,579,256 A | | 11/1996 | Kajigaya et al. |
| 5,586,072 A | * | 12/1996 | Longway et al. .............. 365/63 |
| 5,602,772 A | * | 2/1997 | Nakano et al. ................ 365/51 |
| 5,618,747 A | | 4/1997 | Lou |
| 5,625,234 A | | 4/1997 | Suzuki et al. |
| 5,650,647 A | | 7/1997 | Taguchi et al. |
| 5,671,175 A | | 9/1997 | Liu et al. |
| 5,691,933 A | * | 11/1997 | Takenaka ..................... 365/63 |
| 5,773,892 A | * | 6/1998 | Morikawa et al. ........... 257/758 |
| 5,808,334 A | | 9/1998 | Taguchi |
| 5,821,592 A | * | 10/1998 | Hoenigschmid et al. .... 257/390 |
| 5,864,181 A | | 1/1999 | Keeth |
| 5,864,496 A | * | 1/1999 | Mueller et al. ................. 365/69 |
| 5,870,343 A | | 2/1999 | Chi et al. |
| 5,877,976 A | * | 3/1999 | Lattimore et al. ............. 365/63 |
| 5,877,992 A | | 3/1999 | Wu et al. |
| 5,886,919 A | * | 3/1999 | Morikawa et al. ............ 365/69 |
| 5,892,702 A | | 4/1999 | Okamoto et al. |
| 5,909,388 A | * | 6/1999 | Mueller ....................... 365/63 |
| 5,917,744 A | * | 6/1999 | Kirihata et al. ............... 365/63 |
| 5,930,178 A | | 7/1999 | Hsu et al. |
| 5,936,892 A | | 8/1999 | Wendell |
| 5,999,451 A | | 12/1999 | Lin et al. |
| 6,008,084 A | | 12/1999 | Sung |
| 6,008,514 A | | 12/1999 | Wu |
| 6,018,172 A | * | 1/2000 | Hidaka et al. ................ 257/296 |
| 6,034,879 A | | 3/2000 | Min et al. |
| 6,084,307 A | | 7/2000 | Keeth |
| 6,091,620 A | | 7/2000 | Kablanian |
| 6,118,708 A | * | 9/2000 | Yoshida et al. .............. 365/190 |
| 6,118,727 A | | 9/2000 | Allan et al. |
| 6,137,711 A | | 10/2000 | Tan |
| 6,137,730 A | | 10/2000 | Chie |
| 6,140,805 A | | 10/2000 | Kaneko et al. |
| 6,163,475 A | | 12/2000 | Proebsting |
| 6,165,833 A | | 12/2000 | Parekh et al. |
| 6,168,985 B1 | | 1/2001 | Asano et al. |
| 6,172,389 B1 | | 1/2001 | Sakoh |
| 6,205,044 B1 | | 3/2001 | Feurle et al. |
| 6,222,275 B1 | | 4/2001 | Keeth |
| 6,226,216 B1 | | 5/2001 | Yu |
| 6,233,197 B1 | | 5/2001 | Agrawal et al. |
| 6,258,663 B1 | | 7/2001 | Koh et al. |
| 6,272,062 B1 | | 8/2001 | Mueller et al. |
| 6,282,135 B1 | | 8/2001 | Proebsting |
| 6,285,612 B1 | | 9/2001 | DeBrosse |
| 6,342,419 B1 | | 1/2002 | Tu |
| 6,370,078 B1 | * | 4/2002 | Wik et al. ............... 365/230.05 |
| 6,377,504 B1 | | 4/2002 | Hilbert |
| 6,462,998 B1 | | 10/2002 | Prosbsting |
| 6,570,781 B1 | * | 5/2003 | Lee et al. ..................... 365/63 |
| 6,574,128 B1 | * | 6/2003 | Morgan ....................... 365/72 |
| 6,593,183 B1 | | 7/2003 | Parekh et al. |
| 6,680,859 B1 | * | 1/2004 | Lee et al. ..................... 365/63 |
| 6,687,146 B2 | * | 2/2004 | Kurjanowicz et al. ......... 365/63 |
| 6,947,324 B1 | * | 9/2005 | Lee et al. ............... 365/185.05 |
| 7,184,290 B1 | * | 2/2007 | Lee et al. ..................... 365/63 |
| 7,199,471 B2 | * | 4/2007 | Houston ..................... 257/758 |
| 2002/0140020 A1 | | 10/2002 | Wu et al. |

FOREIGN PATENT DOCUMENTS

| | | |
|---|---|---|
| JP | 405225772 A | 9/1993 |
| JP | 06029487 | 2/1994 |
| KR | 9300811 | 2/1993 |

\* cited by examiner

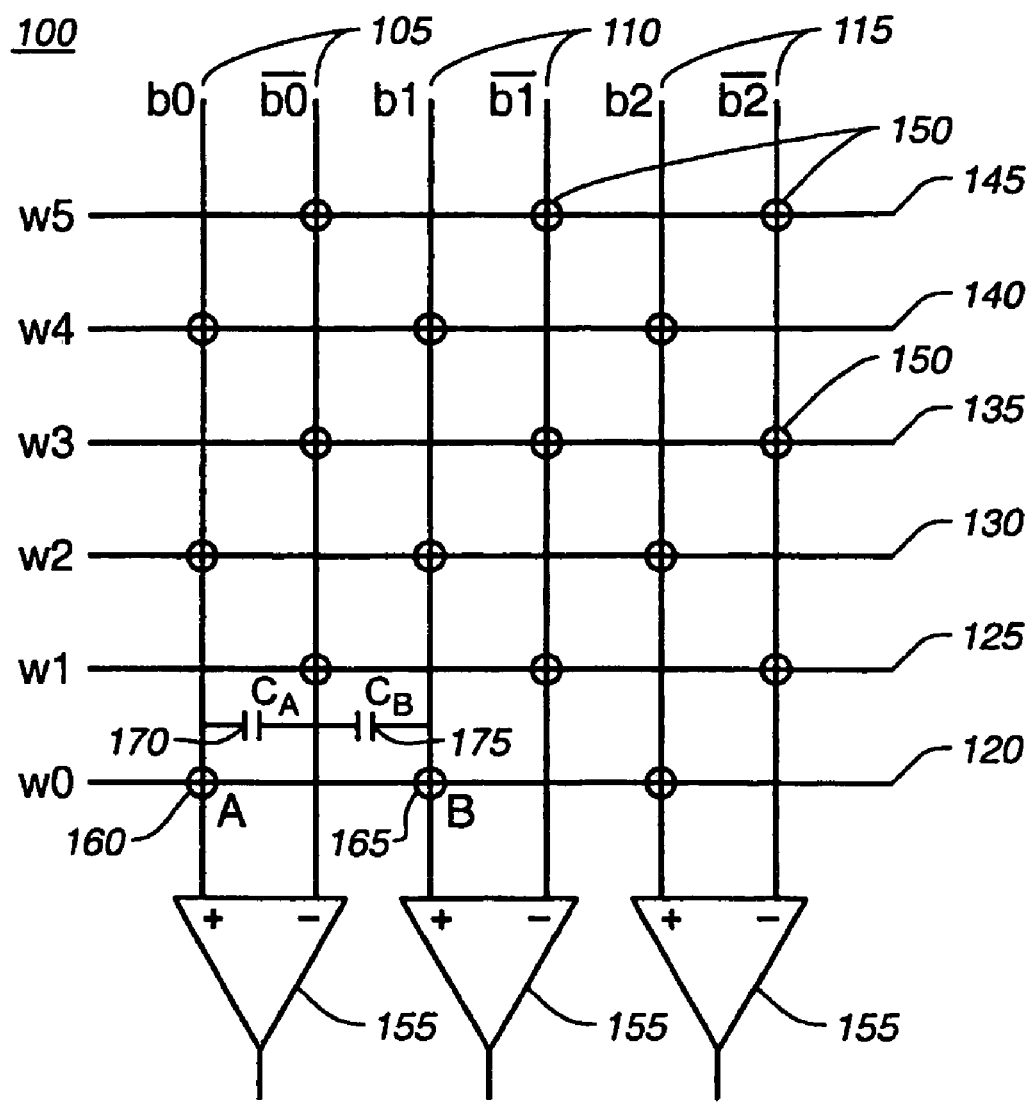
FIG._1 (PRIOR ART)

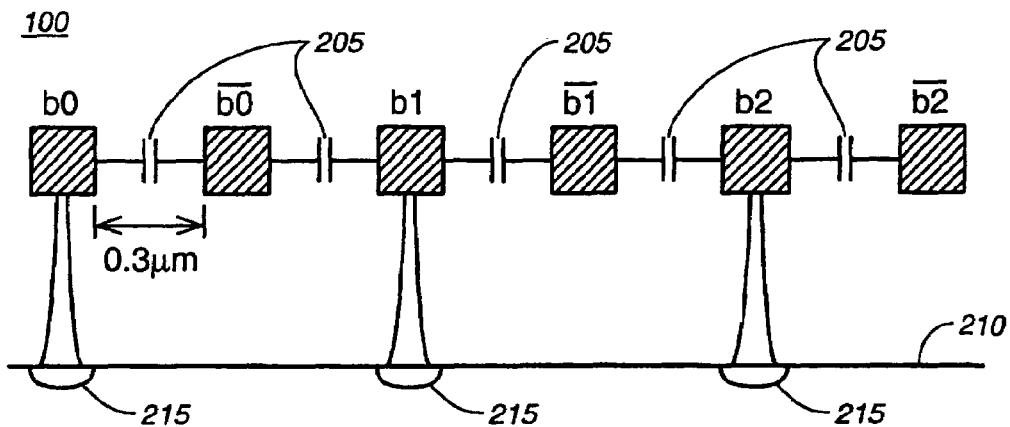
FIG._2 *(PRIOR ART)*
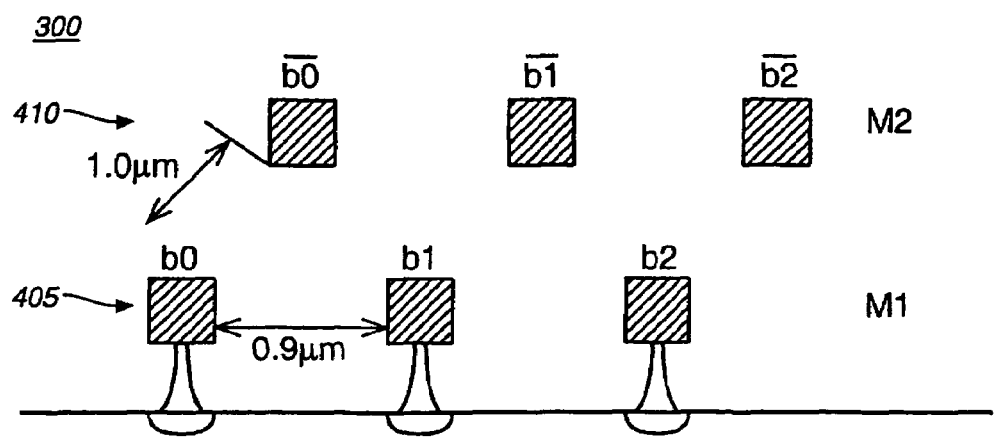
FIG._4

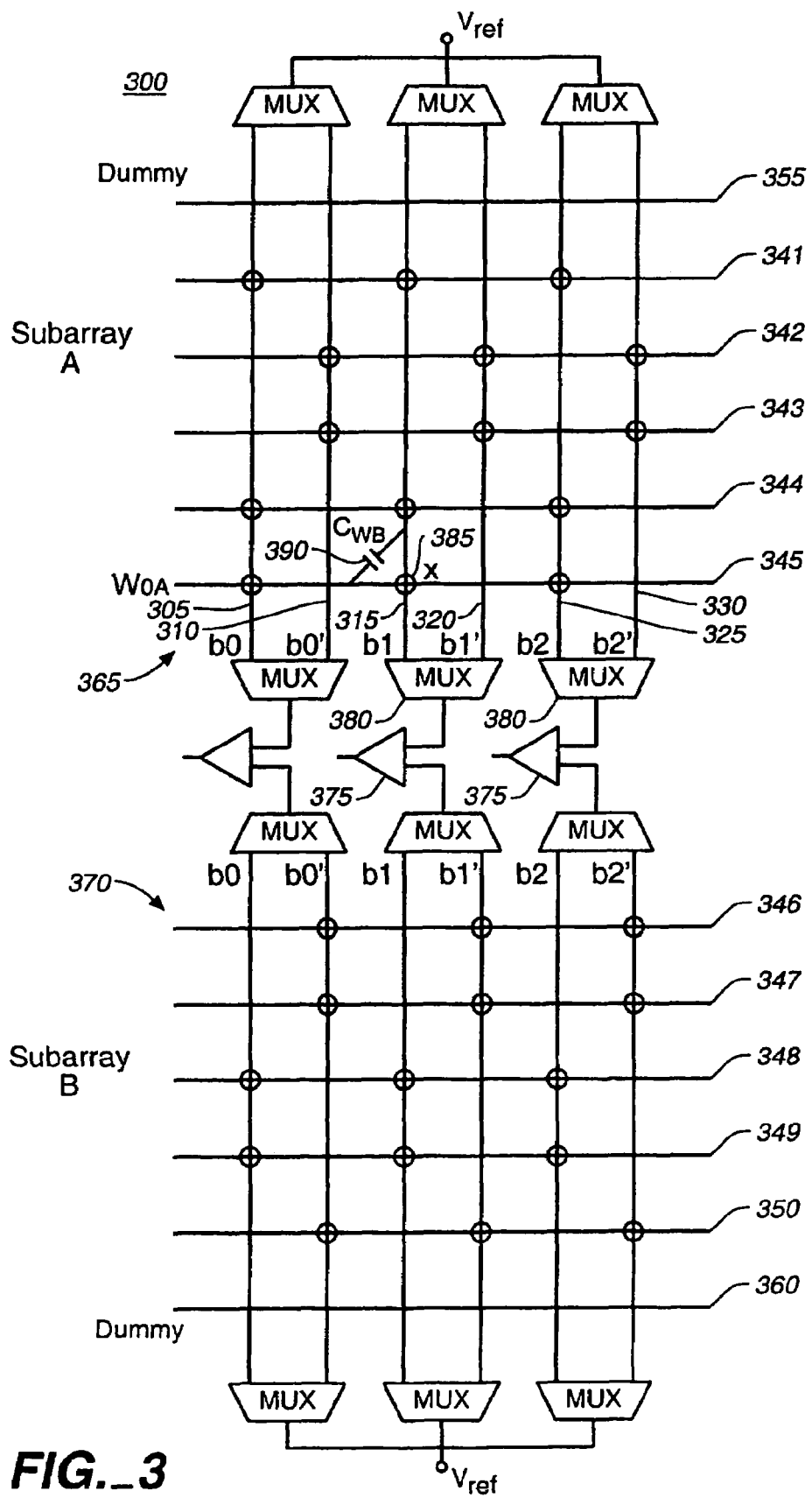
FIG._3

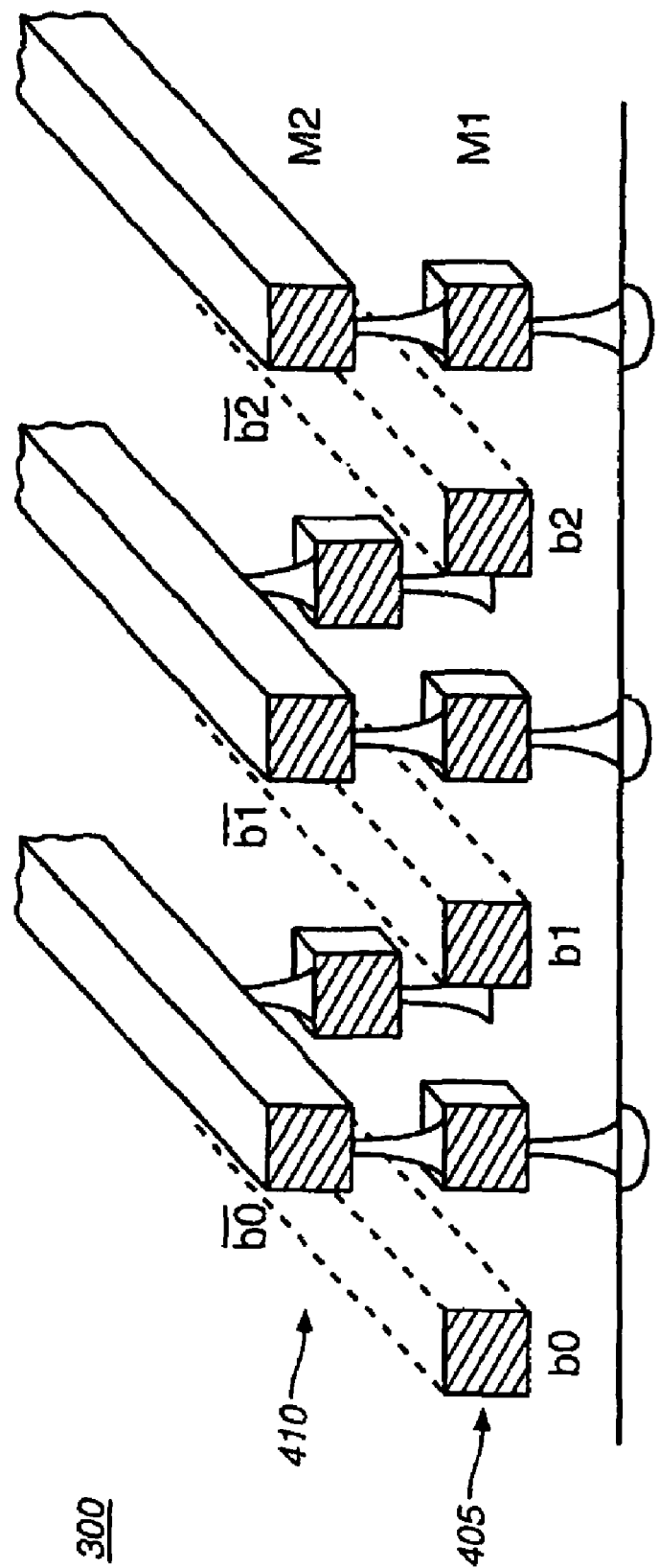
FIG._5

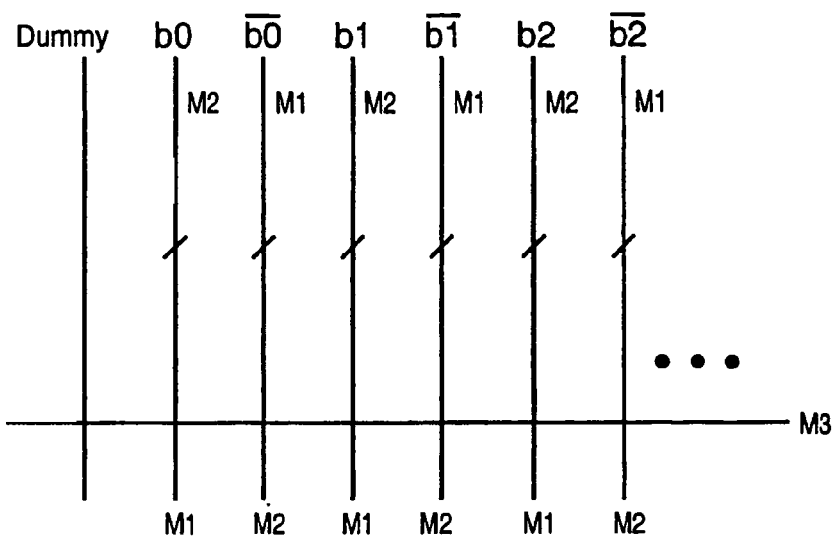
FIG._6
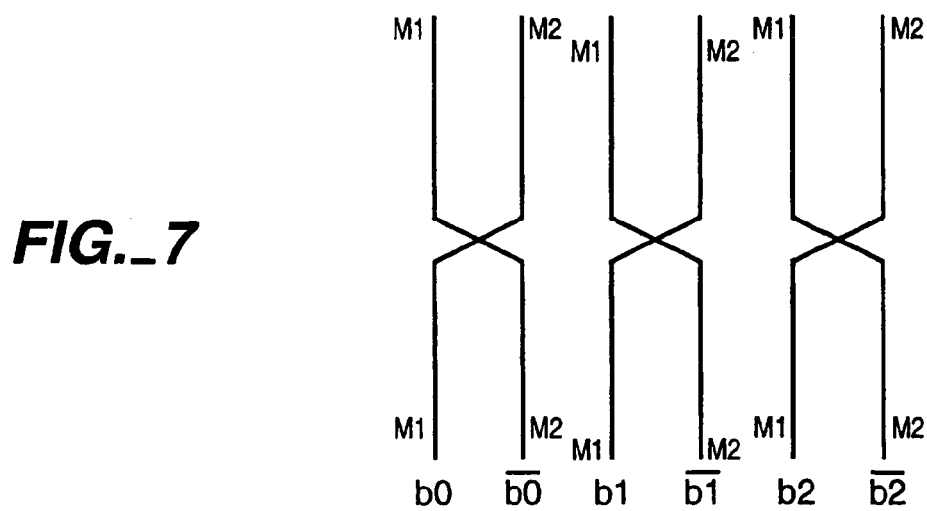
FIG._7
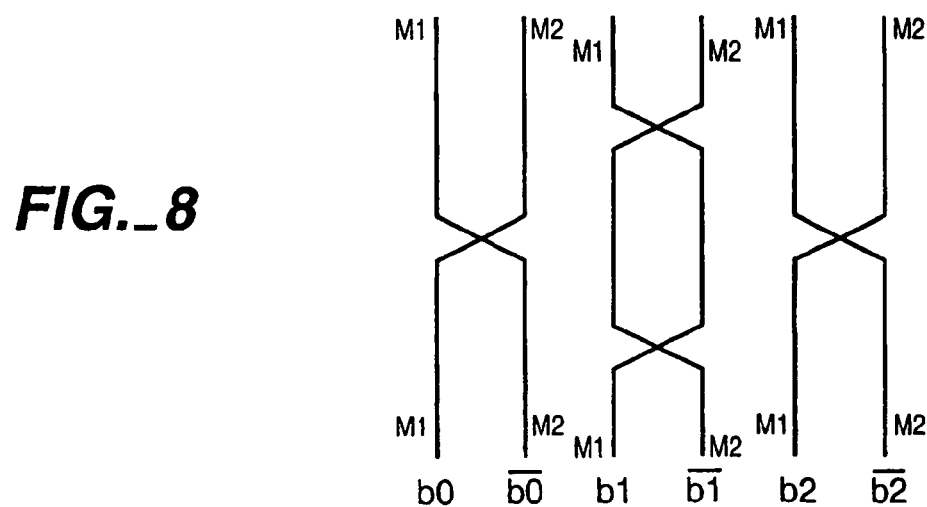
FIG._8

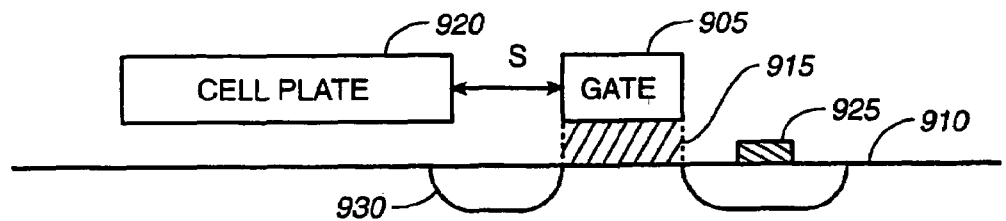
FIG._9 (PRIOR ART)
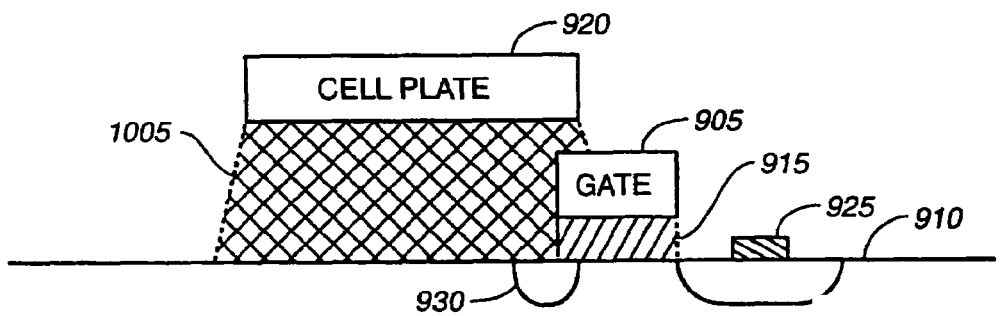
FIG._10
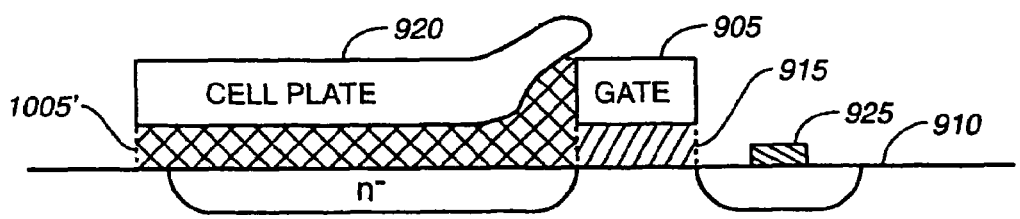
FIG._11
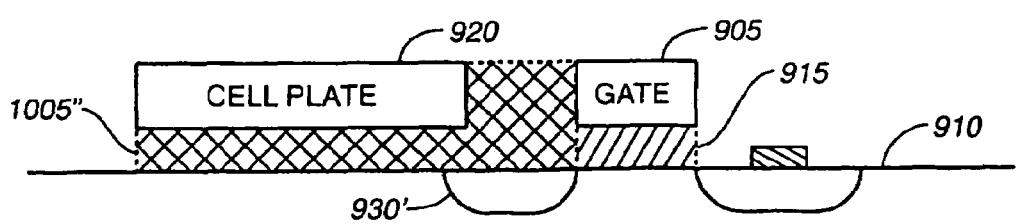
FIG._12

LOGIC PROCESS DRAM

CROSS-REFERENCE TO RELATED APPLICATIONS

This application is a divisional of U.S. patent application Ser. No. 11/138,681, filed on May 27, 2005, now U.S. Pat. No. 7,184,290 which is a divisional of U.S. patent application Ser. No. 10/734,060, filed Dec. 12, 2003 (now U.S. Pat. No. 6,947,324), which is a continuation of U.S. patent application Ser. No. 10/336,423, filed Jan. 2, 2003 (now U.S. Pat. No. 6,680,859), which is a divisional of U.S. patent application Ser. No. 09/881,474 filed Jun. 14, 2001 (now U.S. Pat. No. 6,570,781), which claims priority under 35 U.S.C. § 119 (e) to U.S. Provisional Application Ser. No. 60/214,789, filed Jun. 28, 2000, the contents of each of which are incorporated herein by reference.

BACKGROUND OF THE INVENTION

1. Field of the Invention

The present invention relates to a dynamic random access memory (DRAM) device, and more particularly to an apparatus and a method for improving signal-to-noise ratio and reducing overall bit line capacitance and area in a DRAM.

2. Description of the Related Art

Dynamic random access memory (DRAM) devices include an array of individual memory cells for storing information. These memory cells are dynamic in that they will only hold a particular quantity of information for a short period of time. Therefore, the cells must be read and refreshed at periodic intervals. A common conventional cell configuration includes one transistor and one capacitor. The transistor is connected between a bit line and the capacitor. The transistor is gated by a word line signal. A bit of information is read from the cell to the associated bit line or written to the cell from the bit line through the transistor.

DRAM devices are very well known in the literature and are the subject of many patents. For example, see U.S. Pat. Nos. 6,222,275; 6,205,044; 6,168,985; 6,084,307; 6,034,879; 6,008,084; 5,870,343; 5,864,181; 5,671,175; 5,625,234; 5,579,256; 5,534,732; 5,416,734; 5,241,497; 5,014,110; 4,970,564; 4,967,396; 4,914,502; and KR9300811, the contents of each of which are incorporated herein by reference.

Referring to FIG. 1, a top view of a traditional folded bit line DRAM cell arrangement 100 includes three bit line pairs 105, 110, 115 and six word lines 120, 125, 130, 135, 140, 145, with memory cells 150 located at every other bit line—word line intersection. In a folded bit line architecture, along each word line direction, there is a cell connected to every other bit line. Within each bit line pair, the bit line with the cell is called the sense bit line, and the adjacent bit line without a cell is called the reference bit line. The sense bit line and adjacent reference bit line are respectively coupled to the positive and negative inputs of a differential amplifier 155. In a typical scenario, prior to activation of word line w0 120, all bit lines are precharged to a voltage level $V_{ref}$. Cell A 160 and cell B 165 may be assumed to have an initial voltage of $V_{ref}+\Delta V$. After w0 is activated, both b0 and b1 will attain a value greater than $V_{ref}$; this may be designated as $V_{ref}+\Delta V_x$. If b0 remains at $V_{ref}$, the voltage across the differential amplifier coupled to b0 and b0 would be $V_{ref}+\Delta V_x-V_{ref}=\Delta V_x$. However, because of the capacitances $C_A$ 170 and $C_B$ 175, b0 will not remain at $V_{ref}$; rather, it will be $V_{ref}+\Delta V_n$, due to coupling from b0 and b1. Hence, the differential voltage to the amplifier will be $(V_{ref}+\Delta V_x)-(V_{ref}+\Delta V_n)=\Delta V_x-\Delta V_n$. Thus, the differential voltage is reduced as a result of the effect of the capacitances $C_A$ and $C_B$.

Referring to FIG. 2, a cross-sectional view of the arrangement 100 illustrates the cross-coupling capacitances 205 between adjacent bit lines. Each bit line pair is connected to a substrate 210 via a diffusion region 215. As the number of cells in a DRAM increases, each bit line is connected to more cells, and bit line capacitance increases. As technology progresses toward DRAMs having larger information capacities, bit line capacitance of conventional designs becomes unacceptably high. Accordingly, there is a need for DRAM cell arrays having reduced bit line capacitance.

Referring to FIG. 9, a physical construction of the arrangement 100 is illustrated. A gate 905 of a transistor is connected to a substrate 910 by a gate oxide 915. A cell plate 920 is located in horizontal alignment with the gate 905, but with some minimum lateral spacing S. A bit line contact 925 connects a bit line to the a source of the transistor. A diffusion layer 930 is a drain of the transistor. As the number of cells in a DRAM increases, the cumulative effect of the minimum lateral spacings between transistor gates and cell plates causes the area of the DRAM to become unacceptably high. Accordingly, there is a need for a DRAM cell array having reduced overall area.

SUMMARY OF THE INVENTION

The present invention is intended to address the need for a DRAM device having a reduced bit line capacitance and reduced area.

In one aspect, the invention provides a semiconductor integrated circuit device, including a dynamic random access memory (DRAM) unit. The DRAM unit includes a substrate, a plurality of bit line pairs, a plurality of activatable word lines, a plurality of memory cells, a plurality of multiplexers, and a first interconnect layer and a second interconnect layer. Each bit line pair includes a first bit line and a second bit line. At most one word line can be activated at a time. Each bit line pair is associated with both interconnect layers. The first bit line and the second bit line within each bit line pair may be aligned with each other in an end-to-end arrangement. Each word line may be associated with either all of the first bit lines or all of the second bit lines, such that a first array is formed by the first bit lines and their associated word lines and a second array is formed by the second bit lines and their associated word lines. When a word line is activated, the array to which the activated word line belongs may act as a sense array, and the array to which the activated word line does not belong may act as a reference array. The device may also include an activatable dummy word line in the first array and an activatable dummy word line in the second array, and the device may then be configured to detect signal levels in a common mode.

The two interconnect layers may be metal layers, polysilicon layers, or one metal layer and one polysilicon layer. The first bit line and the second bit line within each bit line pair may be adjacent to each other. The first bit line and the second bit line within each bit line pair may be twisted at least one point such that half of each bit line is associated with the first metal layer and half of each bit line is associated with the second metal layer. The first bit line and the second bit line within at least one bit line pair may be twisted at least two points such that half of each bit line is associated with the first metal layer and half of each bit line is associated with the second metal layer. The DRAM unit may be manufactured using a logic process or a DRAM process.

In another aspect, a semiconductor integrated circuit device, including a dynamic random access memory (DRAM) unit, is provided. The DRAM unit includes a substrate, a plurality of bit line pairs, a plurality of activatable word lines, a plurality of memory cells, and a plurality of multiplexers. Each bit line pair includes a first bit line and a second bit line. At most one word line can be activated at a time. The first bit line and the second bit line within each bit line pair are aligned with each other in an end-to-end arrangement. Each word line is associated with either all of the first bit lines or all of the second bit lines, such that a first array is formed by the first bit lines and their associated word lines and a second array is formed by the second bit lines and their associated word lines. When a word line is activated, the array to which the activated word line belongs acts as a sense array, and the array to which the activated word line does not belong acts as a reference array. The device may also include an activatable dummy word line in the first array and an activatable dummy word line in the second array. The device may be configured to detect signal levels in a common mode by activating the dummy word line in the reference array and detecting the signal levels differentially as compared to the dummy. The DRAM unit may be manufactured using a logic process or a DRAM process.

In yet another aspect, the invention provides a semiconductor integrated circuit device, including a dynamic random access memory (DRAM) unit. The DRAM unit includes a substrate and a plurality of memory cells. Each memory cell includes a transistor having a gate, a gate oxide for binding the gate to the substrate, a cell plate, and a dielectric material for insulating the cell plate from the substrate. The dielectric material has a high dielectric constant. The gate is constructed using polysilicon. The cell plate is constructed using either polysilicon or a metal conductor. In one embodiment, the cell plate is physically isolated from the gate by a minimum displacement, wherein a direction of the minimum displacement is entirely orthogonal to the substrate such that a component of the minimum displacement parallel to the substrate is substantially zero. In another embodiment, the cell plate and the gate are physically located on different vertical levels as seen from the substrate. The dielectric material may include tantalum oxide, aluminum oxide, or oxinitride. The DRAM unit may be manufactured using a logic process or a DRAM process.

In still another aspect, the invention provides an apparatus for reducing noise and overall bit line capacitance in a DRAM device. The device includes a substrate means, a plurality of pairs of bit line means, a plurality of activatable word line means, a plurality of memory cell means, and a plurality of multiplexer means. Each pair of bit line means includes a first bit line means and a second bit line means. At most one word line means can be activated at a time. The apparatus includes means for constructing the DRAM device using two separate metal layers, including a first metal layer and a second metal layer, and means for associating each pair of bit line means with both metal layers such that an equal proportion of a total length of the reference bit line means and the sense bit line means within each pair of bit line means is associated with each of the first metal layer and the second metal layer. The means for associating may include means for associating the first bit line means within each pair of bit line means with the first metal layer and means for associating the second bit line means within each pair of bit line means with the second metal layer. The apparatus may also include means for aligning the first bit line means and the second bit line means within each pair of bit line means in an end-to-end arrangement, and means for associating each word line means with either all of the first bit line means or all of the second bit line means, such that a first array is formed by the first bit line means and their associated word line means and a second array is formed by the second bit line means and their associated word line means. The device may also include an activatable dummy word line means in the first array and an activatable dummy word line means in the second array. The apparatus may also include means for detecting signal levels in a common mode.

The apparatus may include means for arranging the first bit line means and the second bit line means within each pair of bit line means so that the first bit line means is adjacent to the second bit line means. The apparatus may also include means for twisting the first bit line means and the second bit line means within each pair of bit line means at least one point such that half of each bit line means is associated with the first metal layer and half of each bit line means is associated with the second metal layer. The apparatus may also include means for twisting the first bit line means and the second bit line means within at least one pair of bit line means at least two points such that half of each bit line means is associated with the first metal layer and half of each bit line means is associated with the second metal layer. The DRAM device may be manufactured using either a logic process or a DRAM process.

In yet another aspect, an apparatus for reducing overall noise and bit line capacitance in a DRAM device is provided. The device includes a substrate means, a plurality of pairs of bit line means, a plurality of activatable word line means, a plurality of memory cell means, and a plurality of multiplexer means. Each pair of bit line means includes a first bit line means and a second bit line means. At most one word line means can be activated at a time. The apparatus includes means for aligning the first bit line means and the second bit line means within each pair of bit line means in an end-to-end arrangement, and means for associating each word line means with either all of the first bit line means or all of the second bit line means, such that a first array is formed by the first bit line means and their associated word line means and a second array is formed by the second bit line means and their associated word line means. The device may include an activatable dummy word line means in the first array and an activatable dummy word line means in the second array. The apparatus may include means for detecting signal levels in a common mode by detecting a signal level of the activated word line differentially as compared to the a signal level of the activated dummy word line.

In still another aspect, the invention provides an apparatus for reducing area in a DRAM device. The DRAM device includes a substrate means and a plurality of memory cell means. Each memory cell means includes a transistor having a gate means constructed using polysilicon and a cell plate means. The apparatus includes means for arranging a gate oxide between the gate means and the substrate means, means for physically isolating the cell plate means from the gate means by a minimum displacement to prevent short circuits, and means for insulating the cell plate from the substrate using a dielectric material having a high dielectric constant. In one embodiment, a direction of the minimum displacement is entirely orthogonal to the substrate means such that a component of the minimum displacement parallel to the substrate means is substantially zero. In another embodiment, the cell plate means and the gate means are physically located on different vertical levels as seen from the substrate means. The dielectric material may include tantalum oxide, aluminum oxide, or oxinitride. The DRAM device may be manufactured using a logic process or a DRAM process.

In another aspect, a method of reducing overall noise and bit line capacitance in a logic process DRAM device is provided. The device includes a substrate, a plurality of bit line pairs, a plurality of activatable word lines, a plurality of memory cells, and a plurality of multiplexers. Each bit line pair includes a first bit line and a second bit line. At most one word line can be activated at a time. The method includes the steps of constructing the DRAM device using two separate metal layers, including a first metal layer and a second metal layer, and associating each bit line pair with both metal layers such that an equal proportion of a total length of the first bit line and the second bit line within each bit line pair is associated with each of the first metal layer and the second metal layer. The step of associating may include associating the first bit line within each bit line pair with the first metal layer and associating the second bit line within each bit line pair with the second metal layer. The method may also include the steps of aligning the first bit line and the second bit line within each bit line pair in an end-to-end arrangement, and associating each word line with either all of the first bit lines or all of the second bit lines, such that a first array is formed by the first bit lines and their associated word lines and a second array is formed by the second bit lines and their associated word lines. The device may include an activatable dummy word line in the first array and an activatable dummy word line in the second array. The method may include the step of detecting signal levels in a common mode by detecting a signal level of the activated word line differentially as compared to a signal level of the activated dummy word line.

The method may include the steps of arranging the first bit line and the second bit line within each bit line pair so that the first bit line is adjacent to the second bit line. The method may include the step of twisting the first bit line and the second bit line within each bit line pair at least one point such that half of each bit line is associated with the first metal layer and half of each bit line is associated with the second metal layer. The method may also include the step of twisting the first bit line and the second bit line within at least one bit line pair at least two points such that half of each bit line is associated with the first metal layer and half of each bit line is associated with the second metal layer. The DRAM device may be manufactured using a logic process or a DRAM process.

In yet another aspect, the invention provides a method of reducing overall bit line capacitance in a DRAM device. The device includes a substrate, a plurality of bit line pairs, a plurality of activatable word lines, a plurality of memory cells, and a plurality of multiplexers. Each bit line pair includes a first bit line and a second bit line. At most one word line can be activated at a time. The method includes the steps of aligning the first bit line and the second bit line within each bit line pair in an end-to-end arrangement, and associating each word line with either all of the first bit lines or all of the second bit lines, such that a first array is formed by the first bit lines and their associated word lines and a second array is formed by the second bit lines and their associated word lines. The device may include an activatable dummy word line in the first array and an activatable dummy word line in the second array. The method may include the step of detecting signal levels in a common mode. The DRAM device may be manufactured using a logic process or a DRAM process.

In still another aspect, the invention provides a method of reducing area in a DRAM device. The DRAM device includes a substrate and a plurality of memory cells. Each memory cell includes a transistor having a gate constructed using polysilicon and a cell plate. The method includes the steps of arranging a gate oxide between the gate and the substrate and insulating the cell plate from the substrate using a dielectric material having a high dielectric constant. In one embodiment, the method further includes the step of physically isolating the cell plate from the gate by a minimum displacement to prevent short circuits, wherein a direction of the minimum displacement is entirely orthogonal to the substrate, such that a component of the minimum displacement parallel to the substrate is substantially zero. In another embodiment, the method further includes the steps of physically locating the gate on a first vertical level as seen from the substrate and physically locating the cell plate on a second vertical level as seen from the substrate. The dielectric material may include tantalum oxide, aluminum oxide, or oxinitride. The DRAM device may be manufactured using a logic process or a DRAM process.

BRIEF DESCRIPTION OF THE DRAWINGS

FIG. 1 shows a top view of a folded bit line DRAM cell arrangement according to the prior art.

FIG. 2 shows a cross-sectional view of the DRAM cell arrangement of FIG. 1.

FIG. 3 shows a top view of a folded bit line DRAM cell arrangement in which, for each bit line pair, a sense bit line and a reference bit line are oriented longitudinally with respect to each other, according to the present invention.

FIG. 4 shows a cross-sectional view of the DRAM cell arrangement of FIG. 3, including the use of two separate metal layers within each bit line pair.

FIG. 5 shows a second cross-sectional view of the DRAM cell arrangement of FIG. 3.

FIG. 6 illustrates a DRAM cell arrangement including the use of two metal conductors within each bit line, with the sense bit line and the reference bit line within each pair being configured adjacent to each other.

FIG. 7 illustrates another DRAM cell arrangement, with the bit lines in each bit line pair being twisted symmetrically about each other.

FIG. 8 illustrates another DRAM cell arrangement, with the bit lines in each bit line pair being twisted about each other in another symmetric way.

FIG. 9 illustrates a physical construction of a DRAM cell arrangement according to the prior art.

FIG. 10 illustrates a physical construction of a DRAM cell arrangement having reduced lateral spacing according to the present invention.

FIG. 11 illustrates a first alternate embodiment of a DRAM cell arrangement having reduced lateral spacing according to the present invention.

FIG. 12 illustrates a second alternate embodiment of a DRAM cell arrangement having reduced lateral spacing according to the present invention.

DETAILED DESCRIPTION OF THE INVENTION

The present invention addresses the need for a DRAM device having an improved signal-to-noise ratio, a reduced overall bit line capacitance, and reduced area. By arranging bit lines in an end-to-end longitudinal configuration, the inventors have reduced the noise generated by adjacent cells. By using two separate metal conductor layers in each bit line, and by creating different bit line pair configurations using the two metals, the inventors have reduced bit line capacitance while allowing for larger DRAM capacities. By minimizing the lateral spacing between the transistor gate and the cell plate, the inventors have reduced the overall area of the DRAM for a given number of cells, thus allowing for larger DRAM capacities. In the following description, the preferred embodiment uses a logic process DRAM device. However, it is noted that a DRAM process DRAM device may also be used.

Referring to FIG. 3, a top view of a hybrid folded bit line DRAM cell arrangement 300 according to a preferred embodiment of the present invention is shown. In the arrangement 300, six bit line pairs b0 305, b0' 310, b1 315, b1' 320, b2 325, and b2' 330 (drawn vertically) and ten word lines 341-350 (drawn horizontally), plus two dummy word lines 355 and 360, are shown. Each bit line pair includes a "sense" bit line and a "reference" bit line. For each bit line pair, the sense bit line and reference bit line are arranged end-to-end in a longitudinal orientation, rather than adjacent to one another. Bit lines are divided into equal segments and their associated word lines form subarrays A 365 and B 370. Bit line sense amplifiers 375 are placed between subarrays. A single sense amplifier can be used to sense data from a pair of bit lines in one subarray with a pair of related bit lines from another subarray. When a word line is activated in one subarray, e.g., subarray A, the bit lines with cells coupled to this word line become sense bit lines, while bit lines in the longitudinally opposed subarray, e.g. subarray B, become reference bit lines. Prior to word line activation, bit lines in both arrays are precharged to a voltage level $V_{ref}$. The converse is true when a word line is activated in subarray B: Bit lines in subarray B become sense bit lines, while the corresponding bit lines in subarray A become reference bit lines. The differential signal between a sense bit line and an associated reference bit line is directed to a related sense amplifier through a 2:1 multiplexer 380. The multiplexer is used to select the bit line with the cell coupled to the activated word line, since in the folded bit line architecture, the cells are attached to every other bit line. The multiplexer control uses the word line address as an input to its logical functions. Other bit lines in the reference subarray are at $V_{ref}$ during the sensing of the sense bit lines in the sense subarray. Since there are no sense bit lines in the reference subarray, there are no noise sources related to bit lines that can couple the reference bit lines, unlike conventional folded bit line sensing schemes.

There are two major reasons for improvement using the present invention: 1) the differential noise injection mechanisms of the conventional folded bit line sensing schemes onto the reference bit lines are eliminated; and 2) cross coupling and total capacitance are reduced when used in conjunction with the two interconnect bit line schemes. Referring to FIG. 3, when word line $W_{0A}$ 345 is activated, a signal having voltage level $V_{ref}+\Delta V_x$ is developed on sense bit line b1 315 due to charge sharing of cell x 385. The sources for noise injection onto sense bit line b1 315 are from sense bit lines b0 305 and b2 325, since these two are the nearest bit lines with activated cells. However, b1 is shielded from b0 and b2 by b0' and b1', which are connected to $V_{ref}$ by a multiplexer 380. To the first order, the coupling to b1 from b0 and b2 is mostly absorbed by b0' and b1', which have a relatively low impedance path to $V_{ref}$. Here, the b0' and b1' bit lines act as shield bit lines. The use of shield bit lines increases the distance between sense bit lines, which tends to reduce noise between them. Noise injection to sense bit lines from activated word line to bit line capacitors (i.e., capacitance $C_{WB}$ 390) are reduced to common mode noise by simultaneously activating a replica dummy word line 360 in the reference subarray (i.e., subarray B 370, since activated word line $W_{0A}$ 345 is in subarray A 365). Multiplexers also are switched in both the sense subarray and the reference subarray so that any coupling associated with the switching becomes common mode noise. The sense amplifier 375 and the multiplexer 380 can be placed in 2 bit line pitch or 4 bit line pitch. In the case of 4 bit line pitch, the sense amplifier and the multiplexer can be placed on both sides of the subarray.

Referring to FIGS. 4 and 5, two cross-sectional views of the arrangement 300 illustrate the use of two separate metal conductor layers 405 and 410, labeled M1 and M2 respectively. One bit line of each pair is placed in the M1 layer, and the other bit line of each pair is placed in the M2 layer. The use of two separate metal layers reduces the cross-coupling capacitance between the two bit lines in each pair; experimentation has shown that this reduction is approximately equal to 30% as compared with a conventional folded bit line DRAM cell arrangement. The increased distances between the two bit lines in each pair and between adjacent bit lines in each metal layer partially account for the reduced cross-capacitance. Referring also to FIG. 2, an exemplary distance between adjacent bit lines is 0.3 µm, whereas an exemplary distance between two bit lines in the same pair but in different metal layers is approximately 1.0 µm, and an exemplary distance between adjacent bit lines within the same metal layer is approximately 0.9 µm. It is noted that the two metal layers entail two distinct interconnect layers, and it is thus possible that one or both layers could be constructed using polysilicon rather than metal. However, the use of two metals is preferred.

Referring to FIGS. 6-8, three different bit line geometries are shown for a folded bit line DRAM cell arrangement using two separate metal layers and adjacent bit lines within each bit line pair. In FIG. 6, half of each bit line is associated with the M1 metal layer, and the other half of each bit line is associated with the M2 metal layer. A dummy bit line is also included for symmetry. A third metal, denoted M3, can be used for the word line straps. Therefore, in the arrangement of FIG. 6, the conventional arrangement of adjacent bit lines is used, but two separate metal layers are used within each bit line, and a third separate metal is used for the word line straps.

In FIG. 7, the sense bit line and the reference bit line within each bit line pair are twisted about each other symmetrically, so that each bit line is associated with the M1 layer for half of its length and the M2 layer for the other half of its length. Twisting bit lines about each other is a well-known method of reducing differential noise from adjacent bit lines to common mode. In the present embodiment, the use of the separate metal layers is combined with the twisting to take advantage of the reductive effects of both aspects. FIG. 8 shows another symmetric twisting arrangement using two metal layers. The first twist occurs at a point located about one-fourth of the way along the length of the bit line, and the second twist occurs at about the three-fourths point. Again, each bit line is associated with the M1 layer for half of its length and the M2 layer for the other half of its length.

Referring to FIG. 10, a physical construction of a DRAM cell according to the present invention is shown. Because the manufacturing process used here involves a deep submicron geometry, gate leakage and tunneling leakage are high. Therefore, it is desirable not to needless waste any area of the DRAM cell. By minimizing the wasted area, the leakage problems are also minimized. As in the case of the conventional DRAM cell construction (i.e., see also FIG. 9), the transistor gate 905 is connected to the substrate 910 by a gate oxide 915, and the substrate 910 includes a diffusion layer 930. However, the cell plate 920 is physically located at a horizontally overlapping position relative to the gate 905, so that there is no lateral spacing between the cell plate 920 and the gate 905. The cell plate 920 must still be physically isolated from the gate 905; otherwise, there can be a short-circuiting problem from the cell plate 920 to the gate 905. Therefore, the cell plate 920 is located at a vertical offset from the gate 905. The cell plate and the gate can be viewed as being on separate vertical levels, as seen from the substrate. This vertical offset causes an decreased capacitance between the cell plate 920 and the substrate 910, and in this context, it is preferable not to decrease the capacitance. To reduce the adverse effect of the vertical offset, a dielectric material 1005, preferably a material having a high dielectric constant such as $Si_3N_4$ tantalum oxide or aluminum oxide or oxinitride, is used to fill in the space between the cell plate 920 and the substrate 910. Typically, the gate is made of polysilicon, and the cell plate may be made of either polysilicon or a metal. By minimizing the lateral spacing between the cell plate and the gate, the overall area is minimized.

FIG. 11 illustrates a first alternate embodiment of a DRAM cell arrangement having reduced lateral spacing according to the present invention. As shown therein a thin high dielectric constant material 1005' such as $Si_3N_4$, tantalum oxide or aluminum oxide or oxinitride, is used to fill in the space between the cell plate 920 and the substrate 910. The thin high dielectric constant material has a thickness is in the range of about 50 Å to 100 Å. As shown therein a lightly doped region n is arranged in under the cell plate. As will be appreciated by one of ordinary skill in the art, by arranging the thin dielectric material 1005' between the cell plate 920 and the gate electrode 905 and the substrate 910, the alignment issue is obviated.

FIG. 12 illustrates a second alternate embodiment of a DRAM cell arrangement having reduced lateral spacing according to the present invention. In this arrangement, As shown therein a thin high dielectric constant material 1005" such as $Si_3N_4$, tantalum oxide or aluminum oxide or oxinitride, is used to fill in the space between the cell plate 920 and the substrate 910. Cell plate 920 is separated by laterally from gate 905, and diffusion later 930' under that area.

While the present invention has been described with respect to what is presently considered to be the preferred embodiment, it is to be understood that the invention is not limited to the disclosed embodiments. To the contrary, the invention is intended to cover various modifications and equivalent arrangements included within the spirit and scope of the appended claims. For example, it is to be understood that the invention is applicable to various choices of metals and dielectrics, and to various schemes of twisting the bit line pairs. As another example, although the preferred embodiment uses a logic process DRAM, the invention is also applicable to a DRAM process DRAM. It is also noted that the invention may be practiced using either a pure memory semiconductor chip or a multifunction semiconductor chip. In the case of the multifunction chip, the DRAM function is commonly referred to as embedded memory. The scope of the following claims is to be accorded the broadest interpretation so as to encompass all such modifications and equivalent structures and functions.

What is claimed is:

1. A semiconductor integrated circuit device, including a dynamic random access memory (DRAM) unit, the DRAM unit comprising:
 a plurality of bit line pairs,
  wherein each bit line pair includes a first bit line and a second bit line, wherein the first bit line and the second bit line within each bit line pair are aligned adjacent to each other;
 a plurality of word lines,
  wherein each word line is associated with the bit lines such that an array is formed by the bit lines and the associated word lines;
 a first interconnect layer and a second interconnect layer,
  wherein each of the bit lines is associated with both the first and second interconnect layers;
 a plurality of memory cells,
  wherein each of the plurality of memory cells is associated with every other bit line along each word line; and
 a plurality of amplifiers,
  wherein each of the plurality of amplifiers is in communication with a first bit line and a second bit line within a bit line pair.

2. The semiconductor integrated circuit device of claim 1, wherein, for each word line, each bit line that is not associated with one of the plurality of memory cells acts as a shield between bit lines that are associated with one of the plurality of memory cells.

3. The semiconductor integrated circuit device of claim 1, wherein the DRAM unit further comprises:
 a plurality of multiplexers in communication with a voltage source input and with a first bit line and a second bit line within a bit line pair.

4. The semiconductor integrated circuit device of claim 3, wherein the DRAM unit further comprises:
 a dummy word line,
  wherein the DRAM unit is configured to detect signal levels in a common mode by activating the dummy word line and detecting a signal level of an activated word line differentially as compared to a signal level of the activated dummy word line.

5. The semiconductor integrated circuit device of claim 4, wherein the first bit line and the second bit line within at least one bit line pair are twisted at least one point such that half of each bit line is associated with the first interconnect layer and half of each bit line is associated with the second interconnect layer.

6. The semiconductor integrated circuit device of claim 1, wherein the first interconnect layer comprises a first metal layer and the second interconnect layer comprises a second metal layer.

7. The semiconductor integrated circuit device of claim 1, wherein the first interconnect layer comprises a metal layer and the second interconnect layer comprises a polysilicon layer.

8. The semiconductor integrated circuit device of claim 1, wherein the first interconnect layer comprises a polysilicon layer and the second interconnect layer comprises a metal layer.

9. The semiconductor integrated circuit device of claim 1, wherein the DRAM unit is manufactured using a logic process.

10. The semiconductor integrated circuit device of claim 1, wherein the DRAM unit is manufactured using a DRAM process.

11. An apparatus for reducing noise and overall bit line capacitance in a dynamic random access memory (DRAM) device, comprising:
 a plurality of pairs of bit line means for conducting electrical signals,
  wherein each pair of bit line means includes a first bit line means and a second bit line means,
   wherein the first bit line means and the second bit line means within each pair of bit line means are aligned adjacent to each other;
 a plurality of word line means,
  wherein each word line means is associated with the bit line means such that an array is formed by the bit line means and the associated word line means;
 a first interconnect layer means and a second interconnect layer means, wherein each bit line means within each pair of bit line means is associated with both the first and second interconnect layer means;

a plurality of means for storing data, wherein each of the plurality of means for storing data is associated with every other bit line means along each word line means; and a plurality of means for amplifying, wherein each of the plurality of means for amplifying is in communication with a first bit line means and a second bit line means within a pair of bit line means.

12. The apparatus of claim 11, wherein, for each word line means, each bit line means that is not associated with one of the plurality of means for storing data acts as a shield between bit line means that are associated with one of the plurality of means for storing data.

13. The apparatus of claim 11, further comprising:

a plurality of means for multiplexing in communication with a voltage source input means and with a first bit line means and a second bit line means within a pair of bit line means.

14. The apparatus of claim 13, wherein the apparatus further comprises: a dummy word line means for conducting electrical signals; and means for detecting signal levels in a common mode by activating the dummy word line means and detecting a signal level of an activated word line means differentially as compared to a signal level of the activated dummy word line means.

15. The apparatus of claim 14, wherein the first bit line means and the second bit line means within at least one pair of bit line means are twisted at least one point such that half of each bit line means is associated with the first interconnect layer means and half of each bit line means is associated with the second interconnect layer means.

16. The apparatus of claim 11, wherein the first interconnect layer means comprises a first metal layer and the second interconnect layer means comprises a second metal layer.

17. The apparatus of claim 11, wherein the first interconnect layer means comprises a metal layer and the second interconnect layer means comprises a polysilicon layer.

18. The apparatus of claim 11, wherein the first interconnect layer means comprises a polysilicon layer and the second interconnect layer means comprises a metal layer.

19. The apparatus of claim 11, wherein the DRAM device is manufactured using a logic process.

20. The apparatus of claim 11, wherein the DRAM device is manufactured using a DRAM process.

21. A method of reducing noise and overall bit line capacitance in a dynamic random access memory (DRAM) device, the DRAM device including a plurality of bit line pairs, a plurality of word lines, a plurality of memory cells, a first interconnect layer and a second interconnect layer, and a plurality of amplifiers, wherein each bit line pair includes a first bit line and a second bit line, the method comprising the steps of associating each of the bit lines with both the first and second interconnect layers; aligning the first bit line and the second bit line within each bit line pair to be adjacent to each other;

associating each word line with the bit lines such that an array is formed by the bit lines and the associated word lines;

associating each of the plurality of memory cells with every other bit line along each word line; and bringing each of the plurality of amplifiers into communication with a first bit line and a second bit line within a bit line pair.

22. The method of claim 21, wherein, for each word line, each bit line that is not associated with one of the plurality of memory cells acts as a shield between bit lines that are associated with one of the plurality of memory cells.

23. The method of claim 21, wherein the DRAM device further includes a plurality of multiplexers, the method further comprising the step of bringing the each of the plurality of multiplexers into communication with a voltage source input and with a first bit line and a second bit line within a bit line pair.

24. The method of claim 21, wherein the DRAM device further includes a dummy word line, the method further comprising the step of detecting signal levels in a common mode by activating the dummy word line and detecting a signal level of an activated word line differentially as compared to a signal level of the activated dummy word line.

25. The method of claim 24, further comprising the step of:

twisting the first bit line and the second bit line within at least one pair of bit lines at least one point such that half of each bit line is associated with the first interconnect layer and half of each bit line is associated with the second interconnect layer.

26. The method of claim 21, wherein the first interconnect layer comprises a first metal layer and the second interconnect layer comprises a second metal layer.

27. The method of claim 21, wherein the first interconnect layer comprises a metal layer and the second interconnect layer comprises a polysilicon layer.

28. The method of claim 21, wherein the first interconnect layer comprises a polysilicon layer and the second interconnect layer comprises a metal layer.

29. The method of claim 21, wherein the DRAM device is manufactured using a logic process.

30. The method of claim 21, wherein the DRAM device is manufactured using a DRAM process.

* * * * *